United States Patent
Pan et al.

(10) Patent No.: US 6,679,981 B1
(45) Date of Patent: *Jan. 20, 2004

(54) INDUCTIVE PLASMA LOOP ENHANCING MAGNETRON SPUTTERING

(75) Inventors: Shaoher X. Pan, San Jose, CA (US); Hiroji Hanawa, Sunnyvale, CA (US); John C. Forster, San Francisco, CA (US); Fusen Chen, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/569,736

(22) Filed: May 11, 2000

(51) Int. Cl.⁷ .................. C23C 14/34; C23C 16/00; H01L 21/00
(52) U.S. Cl. ............. 204/298.06; 204/298.16; 204/298.31; 204/298.34; 156/345.35; 156/345.48; 156/345.49; 118/723 IR
(58) Field of Search ............. 204/298.06, 298.07, 204/298.16, 298.19, 298.31, 298.33, 298.34; 156/345.35, 345.48, 345.49; 118/723 R, 723 ME, 723 MR, 723 E, 723 ER, 723 I, 723 IR, 723 MP

(56) References Cited

U.S. PATENT DOCUMENTS

| | | | |
|---|---|---|---|
| 2,344,138 A | 3/1944 | Drummond | 427/251 |
| 3,109,100 A | 10/1963 | Papp | 250/556 |
| 3,291,715 A * | 12/1966 | Anderson | 204/298.06 |
| 4,431,898 A | 2/1984 | Reinberg et al. | 219/121.43 |
| 4,778,561 A | 10/1988 | Ghanbari | 216/70 |
| 4,867,859 A | 9/1989 | Harada et al. | 204/298.04 |
| 5,061,838 A | 10/1991 | Lane et al. | 219/121.59 |
| 5,106,827 A | 4/1992 | Borden et al. | 505/480 |
| 5,290,382 A | 3/1994 | Zarowin et al. | 156/345.35 |
| 5,505,780 A | 4/1996 | Dalvie et al. | 110/723 MA |
| 5,683,517 A | 11/1997 | Shan | 118/723 E |
| 5,770,982 A | 6/1998 | Moore | 333/32 |
| 5,897,752 A * | 4/1999 | Hong et al. | 204/192.12 |
| 5,948,168 A | 9/1999 | Shan et al. | 118/723 R |
| 5,998,933 A | 12/1999 | Shun'Ko | 315/111.51 |
| 6,041,735 A | 3/2000 | Murzin et al. | 118/723 I |
| 6,150,628 A | 11/2000 | Smith et al. | 219/121.54 |
| 6,348,126 B1 * | 2/2002 | Hanawa et al. | 118/723 I |
| 6,392,351 B1 * | 5/2002 | Shun'ko | 315/111.51 |
| 6,453,842 B1 * | 9/2002 | Hanawa et al. | 118/723 I |

FOREIGN PATENT DOCUMENTS

| | | |
|---|---|---|
| EP | 0 546 852 | 6/1993 |
| EP | 0 836 218 | 4/1998 |
| WO | 99/00823 | 1/1999 |
| WO | 01/11650 | 2/2001 |

* cited by examiner

*Primary Examiner*—Rodney G. McDonald
(74) *Attorney, Agent, or Firm*—Roberts, Abokhair & Mardula LLC

(57) ABSTRACT

A plasma reaction chamber, particularly a DC magnetron sputter reactor, in which the plasma density and the ionization fraction of the plasma is increased by a plasma inductive loop passing through the processing space. A tube has its two ends connected to the vacuum chamber on confronting sides of the processing space. An RF coil powered by an RF power supply is positioned adjacent to the tube outside of the chamber and aligned to produce an RF magnetic field around the toroidal circumference of the tube such that an electric field is induced along the tube axis. Thereby, a plasma is generated in the tube in a loop circling through the processing space.

11 Claims, 4 Drawing Sheets

US 6,679,981 B1

INDUCTIVE PLASMA LOOP ENHANCING MAGNETRON SPUTTERING

FIELD OF THE INVENTION

The invention relates generally to plasma processing of substrates. In particular, the invention relates to a enhancing the plasma for processing a substrate, most particularly for plasma sputtering a metallic layer on a substrate.

BACKGROUND ART

The continuing miniaturization of integrated circuits has been accomplished in large part by the decreasing sizes of the elements of the integrated circuit. At the present time, the minimum lateral feature sizes of integrated circuits for advanced applications is about 0.25 µm and is being pushed rapidly downward to 0.13 µm and even 0.11 µm. At the same time, the thickness of inter-level dielectric layers is being maintained in the region of about 1 µm. As a result of this interaction between shrinking lateral dimension and nearly constant vertical dimension, the aspect ratio of the via or contact holes interconnecting two levels of the integrated circuit is rapidly increasing from 4:1 to 10:1. Filling metal into such a high aspect-ratio hole is a major technological problem.

Sputtering or physical vapor deposition (PVD) is the favored technology for metal hole filling because of its rapid deposition rate and relatively low cost of equipment. However, PVD is not inherently suited to filling of deep, narrow holes because of its generally ballistic nature and nearly isotropic pattern of deposition, which do not foster effective filling of the bottom of such high aspect-ratio holes. Nonetheless, it has been recognized that deep hole filling by PVD can be achieved by ionizing the sputtered atoms and, one way or the other, electrically biasing the wafer being sputter coated so that the ionized sputtered ions are accelerated towards the wafer in a very anisotropic pattern that reaches deeply into the hole.

At least two methods have been recognized for deep hole filling of metals by increasing the ionization fraction of the metallic sputtered atoms. One method uses various techniques to increase the plasma density adjacent to the sputtering target in a diode sputtering reactor and to extend the plasma further away from the target. These methods often involve either small magnetrons which need to be scanned over the target or complexly shaped targets. Furthermore, the high ionization fractions are achieved only at lower chamber pressures which produces electron temperatures typically smaller than that needed to produce a very high ionization fraction of sputtered atoms.

Another method involves inductively coupling RF energy into a plasma source region at least somewhat remote from the wafer being sputter deposited in a reactor otherwise generally configured as a diode reactor. For sputtering, this usually involves an inductive coil wrapped around the periphery of the processing space between the target and the wafer. Such inductive coupling allows a large amount of RF power to be coupled into an extended plasma source region. The combination of a high-density plasma extending over a significant distance and moderate pressures thermalizes the sputtered metal atoms and then ionizes them.

However, inductively coupling RF power into a sputtering reactor for depositing a metal presents some fundamental problems. If the RF induction coil is located outside the chamber, the chamber wall must be dielectric so that it does not short out the RF power. Dielectric chamber walls are available, such as of quartz, but such ceramic walls are generally poorly suited to the extreme vacuum requirements of sputtering, in the neighborhood of $10^{-8}$ Torr. Chamber walls for sputtering reactors are preferably composed of stainless steel, but stainless steel is moderately conductive electrically and would tend to short out RF field induced across it. Furthermore, sputtering metals such as aluminum and copper invariably coats some of the metal onto the chamber walls so that even a dielectric wall becomes conductive after extended use.

As a result, the preferred conventional configuration places the RF coil within the vacuum chamber adjacent to the source plasma it is generating. For sputtering, the coil is usually wrapped around the cylindrical space between the target and the wafer being sputter coated. But, such a configuration presents inherent problems. The RF coil must penetrate the vacuum chamber. More importantly, the RF coil dissipates a large amount of RF power and absorbs energy from the plasma and must therefore be cooled if its temperature is to be maintained below 1000° C. Cooling within a high-vacuum chamber is always difficult particularly when it involves parts that are highly biased electrically.

Accordingly, it is desired to generate a high density plasma without placing an inductive coil inside the chamber.

SUMMARY OF THE INVENTION

The invention can be summarized as a plasma reactor, more particularly a DC magnetron sputter reactor having a negatively biased target, in which one or more tubes external to the reactor are connected to pairs of ports disposed across the processing space of the reactor. When a plasma is excited in the reactor, the plasma extends into the tubes. Each tube defines a plasma current loop through the tube and across the processing space of the reactor. An RF power source powers an inductive coil that is magnetically coupled to the current loop within the tube. That is, the inductive coil is a primary coil and the tube is a secondary coil of an electrical transformer.

DETAILED DESCRIPTION OF THE PREFERRED EMBODIMENTS

Figure 1:
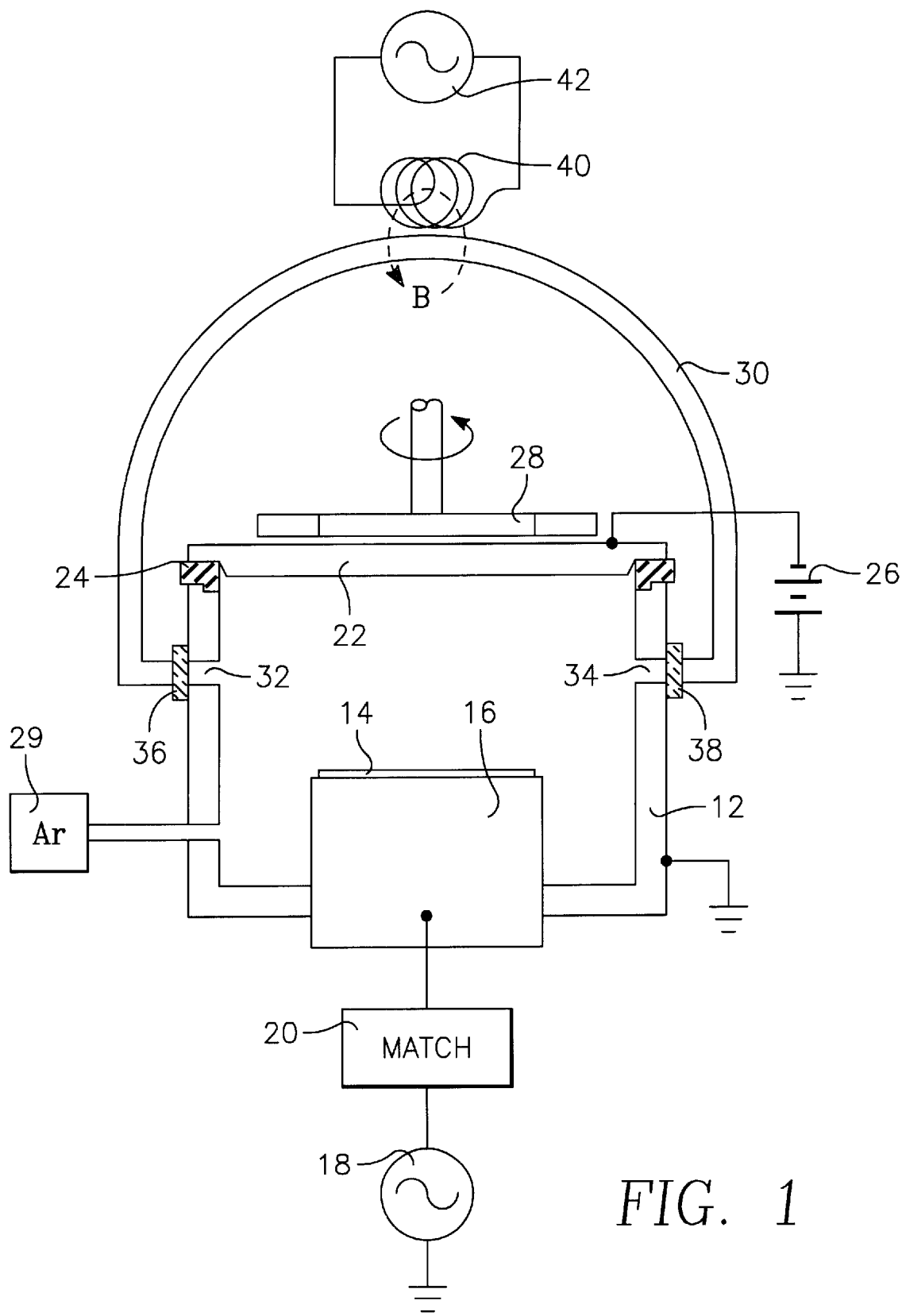
FIG. 1 is a schematic cross-sectional view of a one embodiment of a sputter reactor of the invention.

The invention is based on a conventional DC magnetron sputter reactor. As illustrated in the schematic cross-sectional view of FIG. 1, the reactor includes a stainless steel vacuum chamber 12 that is electrically grounded. A wafer 14 to be sputter coated is supported on a pedestal 16 which may include heating and cooling elements and an electrostatic chuck for holding the wafer 14. Advantageously, the pedestal 16 acts as an electrode and is electrically biased by an RF electrical source 18 through a matching network 20. A target 22 of the material to be sputtered, for example copper, is supported on and seal to the chamber 12 through an electrical isolator 24. The target 22 is negatively biased by a DC power source 26 to a voltage of about −600 VDC. A magnetron 28 is positioned in back of the target and produces a magnetic field inside the chamber to intensify the plasma adjacent to the target 22. The magnetron 28 is typically rotated about the central axis of the chamber to produce more uniform sputtering. A gas source 29 supplies a working gas such as argon into chamber, and unillustrated vacuum ports and vacuum pump maintain the interior of the chamber at a low pressure.

In conventional operation, the DC voltage applied to the target 22 is sufficient to excite the argon into a plasma such that the positively charged argon ions are energetically attracted to the target 22. The energetic argon ions sputter target atoms, e.g. copper, from the target 22, and the sputtered atoms traverse the processing space and coat the wafer 14. If the plasma is intense enough and extends over a significant portion of the trajectory of the sputtered atoms, a sizable fraction of the atoms become ionized. The illustration is simplified and omits certain features such as chamber wall shields and means for inserting the wafer 14 into the chamber. The features described to this point are all conventional and well known.

According to the invention, a plasma is inductively generated remote from the processing space and the plasma forms a current loop passing through the processing space.

A tube 30 has the bores of its two ends connected into the interior of the vacuum chamber through ports 32, 34 in the chamber wall 12. The illustration shows the tube 30 are being disposed above the chamber, but as more accurately illustrated in the plan view of FIG. 2 and the perpendicularly arranged cross-sectioned side view of FIG. 3, the tube length can be shortened by placing it fairly close to the outside of the cylindrical chamber wall 12. The tube 30 may be composed of non-magnetic stainless steel so that it is both a good vacuum wall and does not shunt the magnetic field. Vacuum-sealing RF isolators 36, 38 are placed between the tube 30 and the chamber 12 so as to electrically isolate the tube 30 from the chamber wall 12. Alternatively, a single isolator in the middle of the tube 30 will interrupt the current path in the tube wall.

An RF coil 40 driven by a second RF source 42 is placed closely adjacent to the tube with its winding axis placed perpendicularly to the axis of the tube 30 in that vicinity such that the magnetic field B generated by the RF coil encircles the tube 30 with the result that an electric field proportional to $\partial B/\partial t$ (alternatively expressed as $\omega B$, where $\omega$ is the RF frequency) is generated along the axis of the tube 30. The frequency of the RF source 42 should be above 10 kHz, preferably above 1 MHz, and most preferably is 13.56 MHz. When the tube 30 contains a plasma, it is highly conductive electrically and the tube defines a current path. When the interior of the chamber 12 also contains a plasma, the current path extends through it to complete a low impedance loop. This loop acts as the secondary winding of a transformer in which the RF coil 40 is the primary winding. Thereby, the RF power from the second RF source 42 is inductively coupled into the plasma at a position well exterior of the chamber interior. A matching network including a variable capacitor 46 and a coupling coil 48 wound about the magnetic field B may be used to stabilize the plasma within the chamber and tube.

Note that this configuration differs from the usual one of an inductively coupled plasma in which the RF magnetic field is aligned with chamber or tube axis so that a circumferential electric field is induced inside the chamber. Instead, in the apparatus of FIGS. 1–3, the RF magnetic field circumferentially surrounds the tube to thereby induce an axial electric field in the tube. Also, this configuration is distinctly different from a remote plasma source (RPS) in which a plasma is generated remotely, for example, by microwaves or electron cyclotron resonance (ECR) and the plasma diffuses from the point of generation to the processing space. In such lengthy diffusion, it is typical for the ionized particles in the plasma to recombine although radicals usually survive the diffusion time. Instead, in the apparatus of FIGS. 1–3, the RF energy is applied remotely, but it electrically drives a ionized plasma loop that circulates through the processing space.

The plasma within the tube is primarily composed of the argon working gas, but within the main processing chamber it interacts with the metal atoms sputtered from the target to create metal ions. It is advantageous to supply the argon working gas through the middle portions of the plasma tube so that metal atoms and ions are flushed away from the tube and do not plate its interior.

Figure 2:
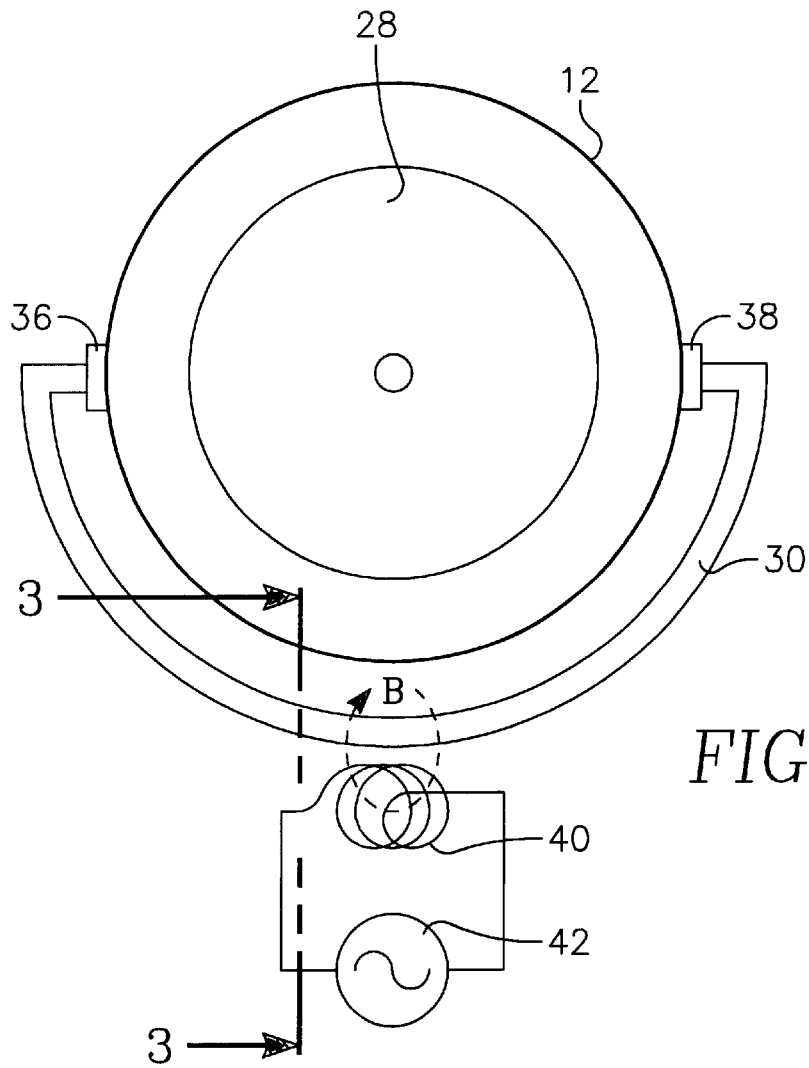
FIG. 2 is a plan view of the reactor of FIG. 1.
Figure 3:
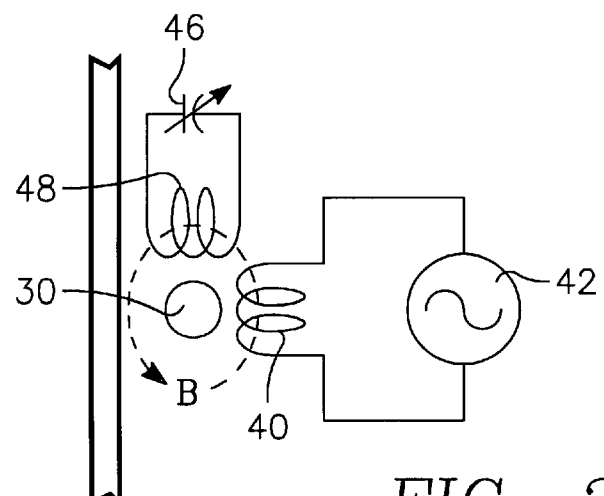
FIG. 3 is a schematic cross-sectional side view of the reactor of FIGS. 1 and 2 taken along view line 3—3 of FIG. 2.

The principle of operation of the apparatus of FIGS. 1–3 has been demonstrated with a sputter reactor in which the target is replaced with a grounded plate connected to the two ends of the plasma tube 30, which had an internal diameter of 2¾ inches (7 cm). The chamber is pressurized with 10 milliTorr of argon. When 1000 W of RF power at 13.56 MHz is applied to a two-turn tube coil 40, a bright plasma forms in the main processing chamber. Furthermore, the plasma is stable and extends over a large portion of the chamber between the grounded target plate and the wafer surface. In this power range, ambient air cooling of the metal tubing is sufficient.

In this experimental arrangement, the magnetic coupling between the tube coil 40 and the tube 36 relies only on air coupling. The efficiency of coupling could be improved by inserting a loop-shaped magnetic transformer core through the interior of the tube coil 40 and around the tube 30. Either the core or the tube could be wrapped around the other member for added magnetic coupling.

Figure 4:
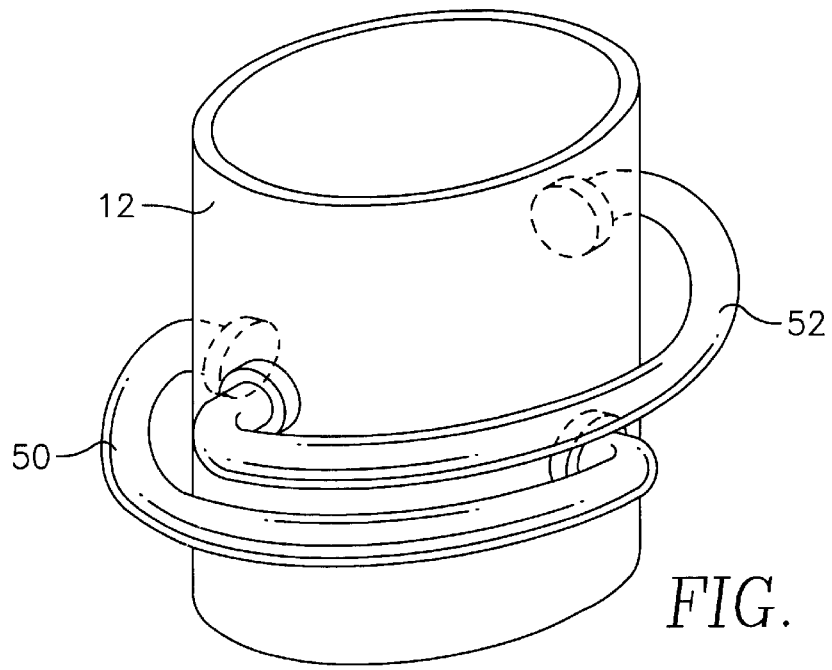
FIG. 4 is an orthographic view of a two-tube embodiment of the invention.

The uniformity of the high-density plasma in the processing chamber can be increased by increasing the number of tubes entering the chamber at different azimuthal points. For example, as illustrated in the orthographic view of FIG. 4, two tubes 50, 52 have their ends connected to four ports arranged at 90° about the chamber 12. Each tube 50, 52 extends around 180° so the two tubes 50, 52 overlap for about 90° and are slightly offset vertically to avoid interfering with each other. The current paths set by the tubes 50, 52 within the chamber are thus offset by 90°.

One advantage of the overlapping portions of the two tubes 50,52 is that a single RF coil and source can be positioned adjacent to the overlapping portions of the tubes 50, 52 and simultaneously drive both tubes 50, 52. However, the two plasma loops will then be synchronized, and care must be taken that an undesired fixed phase difference between the two loops may cause the loops to constructively or destructively interfere and produce maxima and minima of the plasma density in the processing region. If instead independent RF power supplies of nominally the same frequency drive the two tubes 50, 52, the two current loops are uncorrelated on the time scale of the wafer processing, thus assuring no interference.

Figure 5:
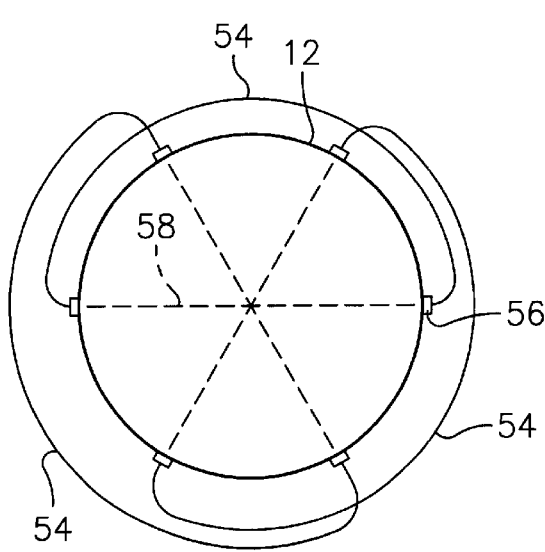
FIG. 5 is a schematic representation, generally in plan view, of a three-tube embodiment of the invention.
Figure 6:
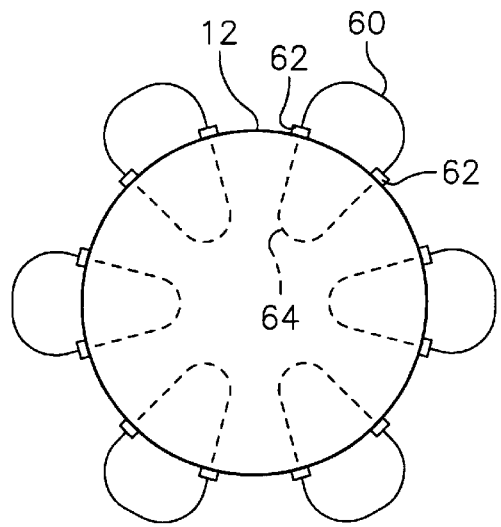
FIG. 6 is a schematic representation, generally in plan view, of a six-tube embodiment of the invention.

Other and more complex plasma circuits are possible. The two tubes 50, 52 of FIG. 4 can be connected between neighboring ones of the four ports rather than opposed ones. Six tubes 54, schematically in FIG. 5, can be connected across opposed ones of six ports arranged at 60° intervals around the chamber 12. The internal conduction paths 58 are overly simplified because they are diffuse and rely strongly upon the relative phases of the three plasma loops. Alternatively, the tubes 54 can connect neighboring ports 56 or even next neighboring ports 56. Yet again, six tubes 60, illustrated schematically in FIG. 6, can be connected across neighboring ones of twelve ports 62 arranged at 300 intervals around the chamber 12 to produce internal conduction paths 64 generally running along the walls of the chamber 12.

Figure 7:
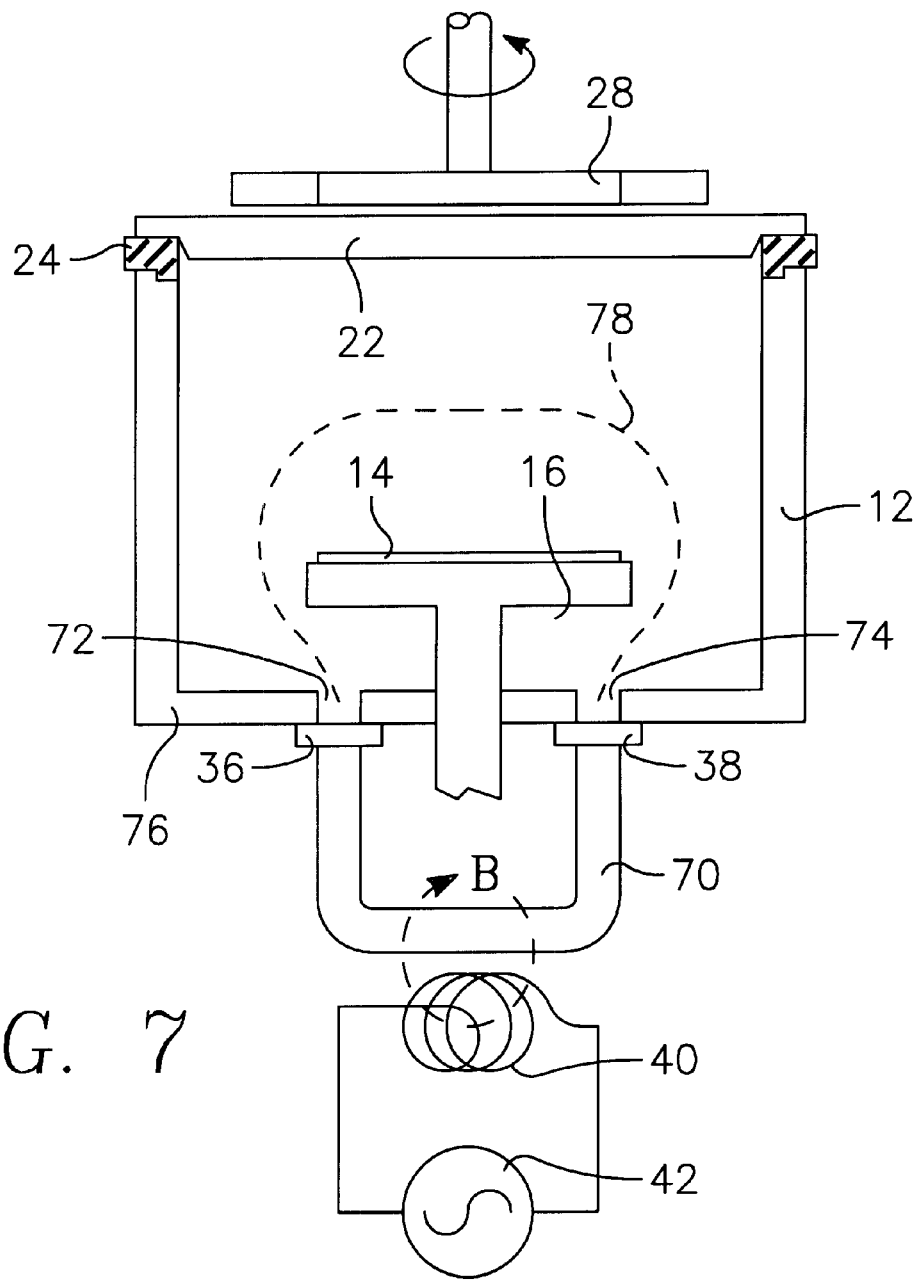
FIG. 7 is a schematic cross-sectional view of an alternative embodiment of a sputter reactor of the invention using a bottom connection.

The previous examples have passed the plasma loops through the sidewalls of the chamber. Alternatively, the tubes can enter other walls of the chamber. For example, as illustrated in the schematic cross-sectional view of FIG. 7, a U-shaped tube 70 may be connected between two ports 72, 74 on a bottom wall 72 of the chamber beneath the pedestal 16 and on opposite lateral sides of the pedestal 16. The tube coil 40 powered by the RF supply 42 is positioned closely adjacent to the bottom portion of the U and induces a plasma loop passing through the interior of the chamber 12. With proper electrical conditions on the pedestal 16, an internal plasma path 78 will extend above the wafer 14, thereby forming a large volume of a high-density plasma between the wafer 14 and the target 22. As before, this configuration may be generalized to multiple tubes.

The invention is not restricted to sputtering reactors. Plasma reactors have been developed for both chemical vapor deposition (CVD) and etching that use means such as RF inductive coils to increase the plasma density. These chambers usually have one or more electrodes configured to capacitively couple power, usually RF power, into the chamber for creating a plasma of the processing gas. This configuration is referred to generally as a diode reactor. Ceramic dielectric windows can be used in these higher-pressure operations to pass the RF inductive power (assuming a metal is not being deposited), but they still present problems. By means of the plasma tubes and loops of the invention, the plasma density within the processing area can be increased without the need for ceramic walls or domes, and the CVD deposition of metal presents much less problem.

The description above has assumed that semiconductor wafers of size 200 to 300 mm are being processed in single-wafer chambers. The invention is not so limited. For example, flat panel displays are being fabricated with semiconductor fabrication techniques on glass substrates have dimensions approach a meter. Very large plasma processing chambers are required. Achieving high plasma densities throughout large chambers has been a problem. The invention allows the use of nearly arbitrarily many plasma tubes and RF sources with associated plasma loops distributed through the chamber to supplement the plasma density and particularly the ionization density.

The invention advantageously allows standard plasma processing chambers to be slightly redesigned with the addition of ports for the plasma tubes, and thus permit low plasma-density chambers to be readily adapted to high plasma-density use.

What is claimed is:

1. A plasma reaction chamber, comprising:
   a vacuum chamber adapted to accommodate a substrate to be processed and having at least one pair of opposed ports formed through side walls of the chamber;
   a respective tube connecting each of the pairs of the ports; and
   a coil adapted for connection to an RF electrical power supply and disposed adjacent to the tube to encircle a circumference of the tube with an RF magnetic field.

2. The plasma reaction chamber of claim 1, further comprising a diode circuit adapted to induce a plasma in the vacuum chamber.

3. The plasma reaction chamber of claim 1, wherein said ports are disposed on sidewalls of said vacuum chamber in an area adjacent a surface of a substrate being processed.

4. The plasma reaction chamber of claim 1 configured as a plasma sputtering reactor.

5. The plasma reaction chamber of claim 1 configured as a plasma etch reactor.

6. The plasma reaction chamber of claim 1 configured as a chamber for plasma enhanced chemical vapor deposition.

7. A plasma reaction chamber comprising:
   a vacuum chamber adapted to accommodate a substrate to be processed and having at least one pair of ports formed through walls of the chamber;
   a respective tube connecting each of the pairs of the ports;
   an RF electrical power supply;
   a coil adapted for connection to the RF electrical power supply and disposed adjacent to the tube to encircle a circumference of the tube with an RF magnetic field; and
   a pedestal having an upper side adapted to support a substrate to be processed and wherein the ports are disposed on a wall of the vacuum chamber facing a bottom side of the pedestal.

8. A DC magnetron sputtering reactor, comprising:
   a vacuum chamber;
   a pedestal within the chamber for supporting a substrate to be sputter coated;
   a target sealed to the chamber comprising a material to be sputter coated;
   a magnetron positioned in back of the target;
   a DC power supply connected to the target;
   a tube having two ends connected to the vacuum chamber;
   an inductive coil positioned adjacent to the tube and disposed to produce a magnetic field encircling the tube; and
   an RF power supply connected to the coil;
   wherein the tube has its two ends connected to a side wall of the vacuum chamber between the target and the pedestal.

9. The reactor of claim 8, wherein the target is metallic.

10. The reactor of claim 9, wherein the target principally comprises copper.

11. A DC magnetron sputtering reactor, comprising:
    a vacuum chamber;
    a pedestal within the chamber for supporting a substrate to be sputter coated;
    a target sealed to the chamber comprising a material to be sputter coated;
    a magnetron positioned in back of the target;
    a DC power supply connected to the target;
    a tube having two ends connected to the vacuum chamber;
    an inductive coil positioned adjacent to the tube and disposed to produce a magnetic field encircling the tube; and
    an RF power supply connected to the coil;
    wherein the tube has its two ends connected to a wall of the vacuum chamber on an opposite side of the pedestal from the target.

* * * * *